United States Patent
Nakano et al.

(10) Patent No.: US 12,464,656 B2
(45) Date of Patent: Nov. 4, 2025

(54) ELECTRONIC CONTROL DEVICE AND METHOD FOR MANUFACTURING THE SAME

(71) Applicant: HITACHI ASTEMO, LTD., Hitachinaka (JP)

(72) Inventors: Kazuhiko Nakano, Hitachinaka (JP); Keiji Hamada, Hitachinaka (JP); Narutoshi Yamada, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 160 days.

(21) Appl. No.: 18/254,526

(22) PCT Filed: Nov. 18, 2021

(86) PCT No.: PCT/JP2021/042472
§ 371 (c)(1),
(2) Date: May 25, 2023

(87) PCT Pub. No.: WO2022/124043
PCT Pub. Date: Jun. 16, 2022

(65) Prior Publication Data
US 2024/0015900 A1    Jan. 11, 2024

(30) Foreign Application Priority Data
Dec. 9, 2020 (JP) ................. 2020-204240

(51) Int. Cl.
*H05K 5/02* (2006.01)
*H05K 5/00* (2006.01)
*H05K 1/18* (2006.01)

(52) U.S. Cl.
CPC ......... *H05K 5/0215* (2022.08); *H05K 5/0047* (2013.01); *H05K 5/0217* (2013.01); *H05K 1/181* (2013.01)

(58) Field of Classification Search
CPC .. H05K 5/0047; H05K 5/0213; H05K 5/0217; H05K 1/181; H05K 5/0215;
(Continued)

(56) References Cited

U.S. PATENT DOCUMENTS
2017/0223854 A1    8/2017  Nishida et al.

FOREIGN PATENT DOCUMENTS
JP    10-050742 A    2/1998
JP    2007-273808 A    10/2007
(Continued)

OTHER PUBLICATIONS

International Preliminary Report on Patentability dated Jun. 22, 2023 issued in International Application No. PCT/JP2021/042472, 12 pages.
(Continued)

*Primary Examiner* — Imani N Hayman
*Assistant Examiner* — Hung Q Dang
(74) *Attorney, Agent, or Firm* — FOLEY & LARDNER LLP

(57) ABSTRACT

An electronic control device comprises a circuit board on which electronic components are mounted, a connector block integrated with a connector that is electrically connected to the circuit board, a base to which the circuit board is fixed, and a cover that can be fitted to circumferential grooves that are formed in the base and the connector block respectively so that a connecting portion of the connector protrudes to the outside while accommodating the circuit board that is fixed to the base. Furthermore, a ventilation hole is formed in a section of the connector block excluding a formation position of the connector so as to communicate an inner space with an outer space of the cover, and a sealing material that seals the ventilation hole is further provided.

8 Claims, 11 Drawing Sheets

(58) Field of Classification Search
CPC .......... B60R 16/02; H01R 13/52; H02G 3/08; H02K 5/22; H02K 11/30
See application file for complete search history.

(56) References Cited

FOREIGN PATENT DOCUMENTS

| | | |
|---|---|---|
| JP | 2017-139055 A | 8/2017 |
| JP | 2019-129229 A | 8/2019 |

OTHER PUBLICATIONS

International Search Report dated Feb. 1, 2022 issued in International Application No. PCT/JP2021/042472, with English translation, 5 pages.

ELECTRONIC CONTROL DEVICE AND METHOD FOR MANUFACTURING THE SAME

TECHNICAL FIELD

The present invention relates to an electronic control device having waterproof performance and a method for manufacturing the same.

BACKGROUND ART

An electronic control device is generally configured to include a housing that includes a base and a cover, a circuit board that is fixed to the base, and a connector block integrated with a connector that is electrically connected to the circuit board. The electronic control device mounted on a vehicle needs to have waterproof performance because it may be exposed to rainwater when driving in the rain or to high-pressure water of a high-pressure washer machine when the vehicle is washed. For this reason, the electronic control device requiring waterproof performance has circumferential grooves that are formed in the base and the connector block, and both ends of the cover are fitted to the circumferential grooves in a state in which a liquid gasket is applied to the circumferential grooves.

When the cover is assembled to the circumferential grooves of the base and the connector block, the air inside the cover is rapidly compressed to increase the internal pressure, and the uncured liquid gasket that has been applied to the circumferential grooves may flow out. Thus, as disclosed in JP2017-139055 A (Patent Document 1), a technique has been proposed to suppress fluctuations in the internal pressure of the cover by forming a ventilation hole inside the connector to communicate the inner space with the outer space of the cover.

REFERENCE DOCUMENT LIST

Patent Document

Patent Document 1: JP2017-139055 A

SUMMARY OF THE INVENTION

Problem to be Solved by the Invention

Introducing a redundant control system in an electronic control device mounted on a vehicle has been considered in order to improve safety; however, the redundancy results in an increase in the number of connectors integrated in the connector block. In this case, the size of the connector may be reduced because space for mounting the electronic control device in the vehicle is limited; however, a connector of reduced size makes it difficult to form a ventilation hole inside the connector.

Accordingly, it is an object of the present invention to provide an electronic control device having a waterproof performance, and a method of manufacturing such an electronic control device which can cope with the size reduction of a connector.

Means for Solving the Problem

According to the first aspect of the present invention, an electronic control device comprises a circuit board on which electronic components are mounted; a connector block integrated with a connector that is electrically connected to the circuit board; a base to which the circuit board is fixed; and a cover that can be fitted to circumferential grooves that are formed in the base and the connector block respectively so that a connecting portion of the connector protrudes to the outside while accommodating the circuit board that is fixed to the base. Furthermore, a ventilation hole is formed in a section of the connector block excluding a formation position of the connector so as to communicate an inner space with an outer space of the cover; and a sealing material that seals the ventilation hole is further provided.

According to the second aspect of the present invention, an electronic control device comprises a circuit board on which electronic components are mounted; a connector block integrated with a connector that is electrically connected to the circuit board; a base to which the circuit board is fixed; and a cover that can be fitted to circumferential grooves that are formed in the base and the connector block respectively so that a connecting portion of the connector protrudes to the outside while accommodating the circuit board that is fixed to the base. The electronic control device further comprises a ventilation hole that is formed in a section of the connector block excluding a formation position of the connector so as to communicate an inner space with an outer space of the cover; and a sealing material which has properties of being in a fluid state in an initial state and being cured over time or by a curing treatment to seal the ventilation hole. Furthermore, in the connector block, at least a part in a radial direction of an open end of the ventilation hole which faces the outer space of the cover is formed with an inclined portion that gradually deepens from the outer space toward the inner space of the cover. Then, after the sealing material is applied from the outer space of the cover to the open end of the ventilation hole that is formed in the connector block, the application of the sealing material is terminated while moving an application position of the sealing material to the inclined portion.

Effects of the Invention

According to the present invention, an electronic control device having a waterproof performance and a method for manufacturing the same can cope with a size reduction of a connector.

MODE FOR CARRYING OUT THE INVENTION

Embodiments for carrying out the present invention will be described in detail below with reference to the accompanying drawings.

Figure 1:
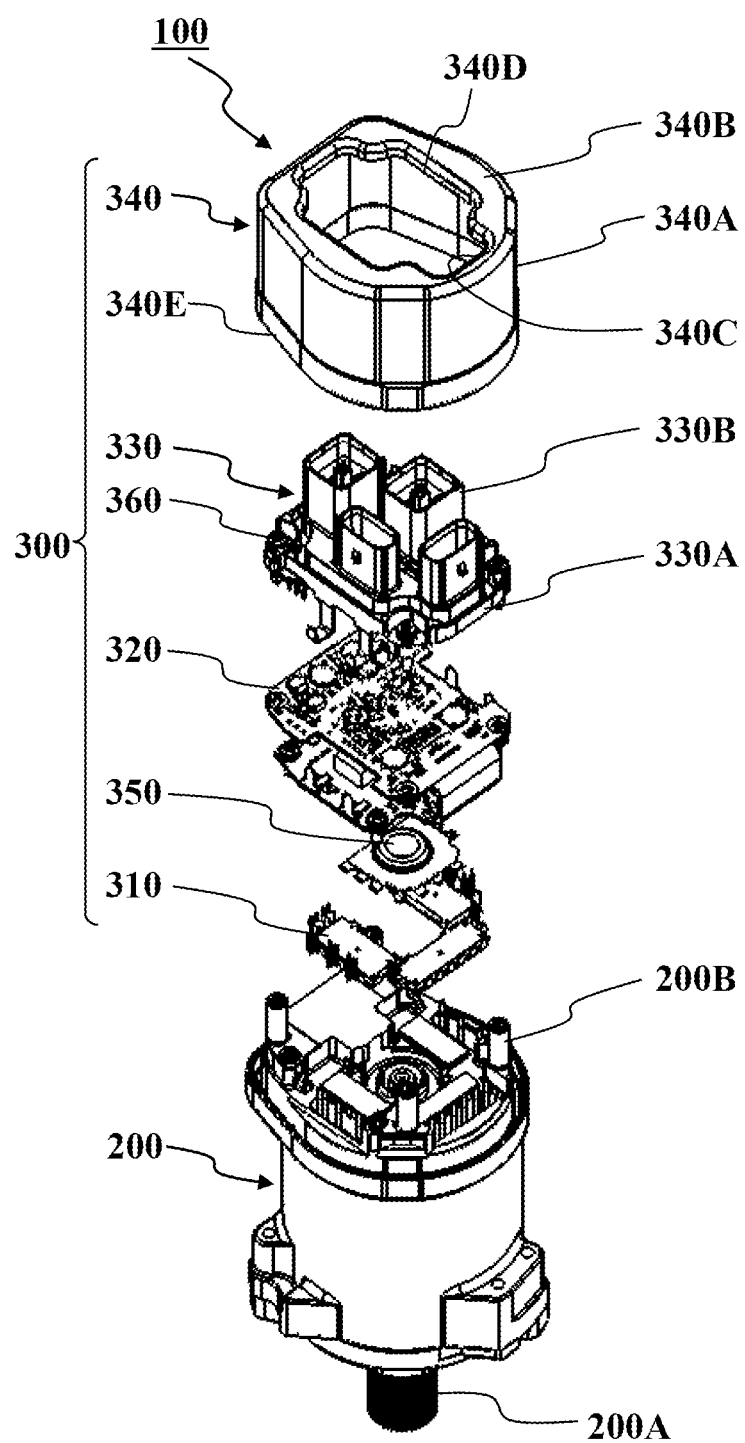
FIG. 1 is an exploded perspective view showing an example of an electronic control device-integrated motor unit.

FIG. 1 shows an example of an electronic control device-integrated motor unit 100. Electronic control device-integrated motor unit 100 is used in an electric power steering system or the like which is an example to which the present invention is applied.

Motor unit 100 includes a motor 200 such as a brushless motor, and an electronic control device 300 that is integrally coupled to motor 200. Electronic control device 300 includes a power module 310 that drives motor 200, a circuit board 320 on which a plurality of electronic components is mounted, a connector block 330, a cover 340, and a ventilation filter 350.

Power module 310 that applies voltage to the stator of motor 200 to rotationally drive an output shaft 200A is arranged on the rear surface of motor 200, that is, the end surface opposite to the end surface from which output shaft 200A connected to the steering gear protrudes. Four columnar mounting bosses 200B are erected and extended axially from the bottom surface at predetermined locations on the rear surface of motor 200. A connector block 330 is fastened and fixed by four screws 360 to the tips of mounting bosses 200B with circuit board 320 interposed between connector block 330 and mounting bosses 200B. In the present embodiment, the bottom surface of motor 200 is an example of the base to which circuit board 320 is fixed. The number of mounting bosses 200B erected on the rear surface of motor 200 is not limited to four, and may be any number depending on the size of circuit board 320 and connector block 330, for example.

Connector block 330 includes a plate-shaped bottom plate 330A to which a plurality of terminal groups electrically connected to the electronic components that are mounted on circuit board 320 is attached, and a plurality of annular connectors 330B extending in the vertical direction from the plate surface of bottom plate 330A to surround each terminal group of bottom plate 330A. Thus, connectors 330B of connector block 330 are electrically connected to the electronic components of circuit board 320. In the example shown in FIG. 1, four connectors 330B are formed integrally with connector block 330, but the number of connectors 330B may be any number depending on the drive circuit of motor 200, for example.

Cover 340 forms a tubular body shape with a bottom, and includes a tubular-body-shaped peripheral wall portion 340A and a bottom wall portion 340B that closes one open end of peripheral wall portion 340A in the axial direction, so that circuit board 320 fixed to the rear surface of motor 200 can be accommodated. Bottom wall portion 340B of cover 340 is formed with an opening portion 340C through which four connectors 330B of connector block 330 may integrally pass through. Thus, the connecting portions of connectors 330B can protrude to the outside through opening portion 340C. The inner peripheral end of opening portion 340C of cover 340 is integrally joined with tubular-body-shaped inner end portion 340D, which extends parallel to the axial direction of peripheral wall portion 340A, and toward the other side of the axial direction of peripheral wall portion 340A. Peripheral wall portion 340A, bottom wall portion 340B, opening portion 340C, and inner end portion 340D may be integrally molded when manufacturing cover 340.

Figure 2:
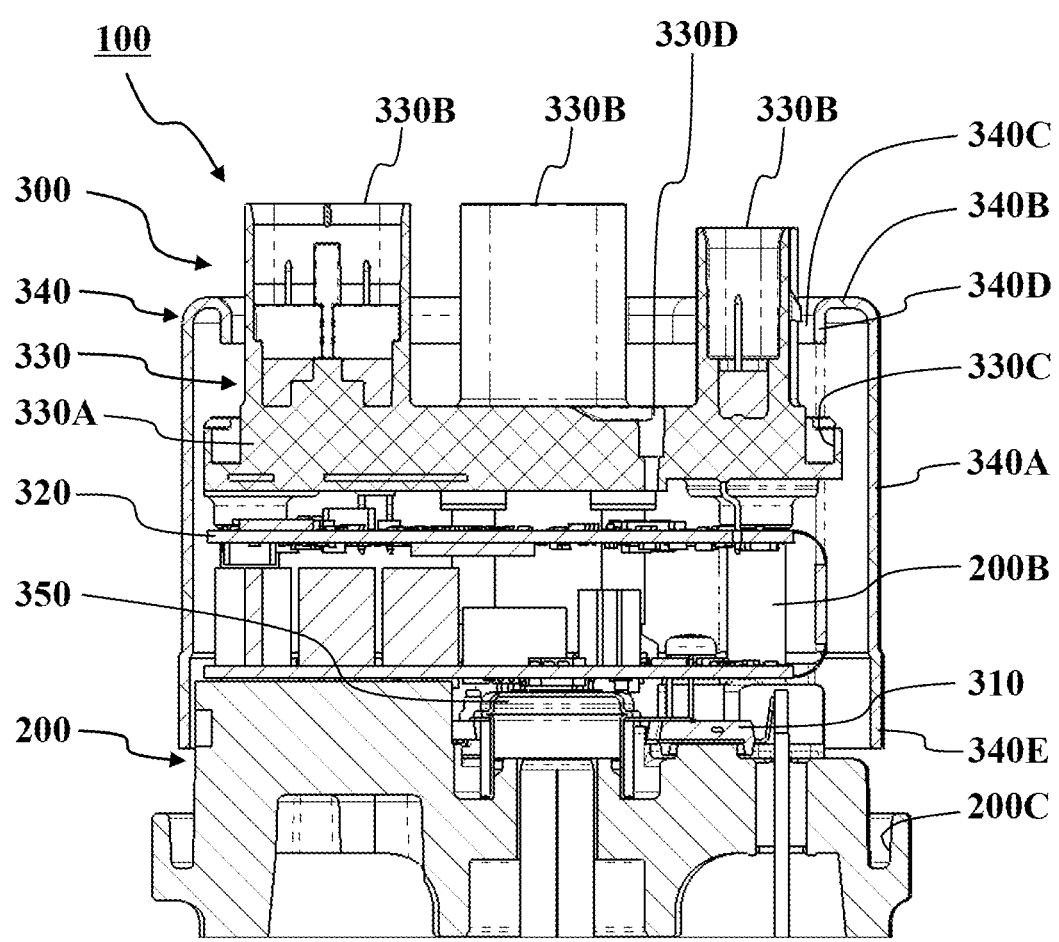
FIG. 2 is a vertical cross-sectional view showing an example of the main part of the motor unit before attaching a cover.
Figure 3:
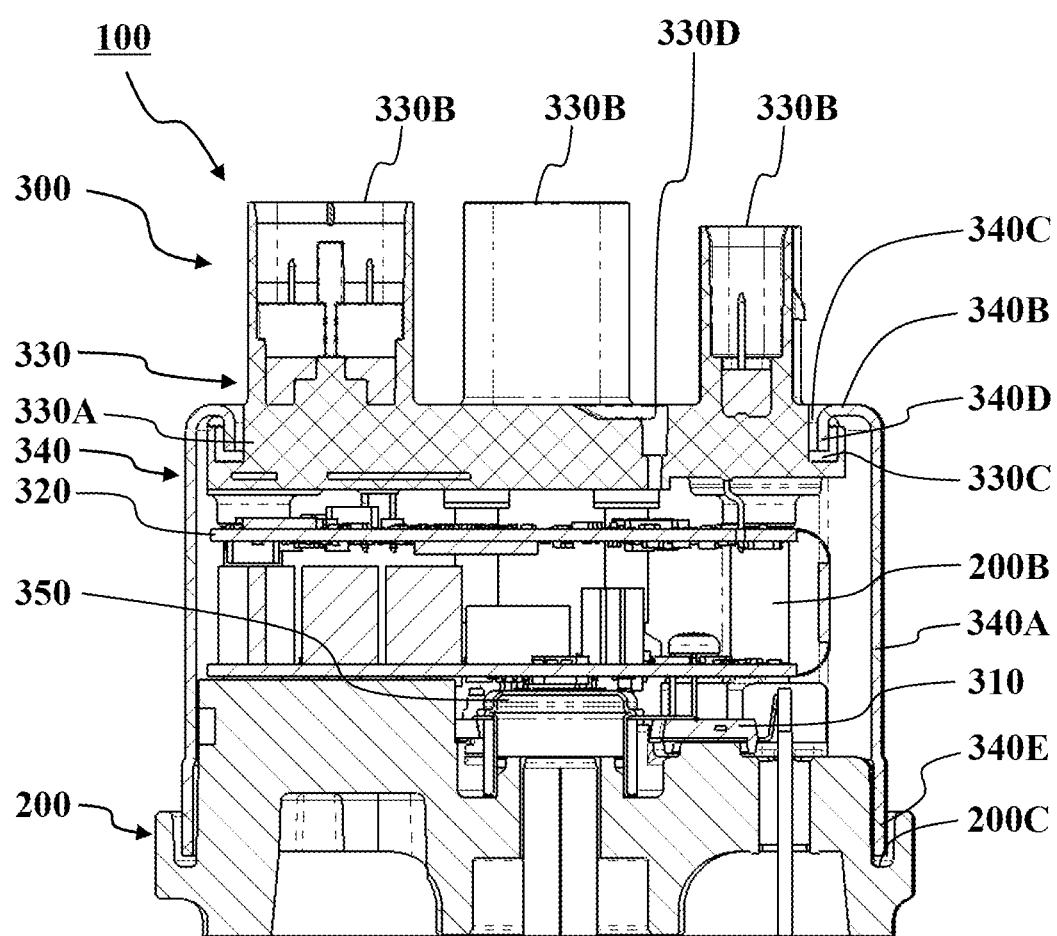
FIG. 3 is a vertical cross-sectional view showing an example of the main part of the motor unit after attaching the cover.

As shown in FIGS. 2 and 3, a circumferential groove 200C is formed on the periphery of the rear surface of motor 200, and the other open end (outer end portion 340E) of peripheral wall portion 340A of cover 340 can be fitted to circumferential groove 200C over a predetermined depth. Also as shown in FIGS. 2 and 3, in bottom plate 330A of connector block 330, a circumferential groove 330C is formed on the periphery of one surface on which connectors 330B are erected, and inner end portion 340D of cover 340 may be fitted to circumferential groove 330C over a predetermined depth. Thus, the inner space of cover 340 may form a sealed space by fitting outer end portion 340E of cover 340 to circumferential groove 200C of motor 200 and fitting inner end portion 340D of cover 340 to circumferential groove 330C of connector block 330, respectively.

Furthermore, a ventilation filter 350 having air permeability and exhibiting waterproof and dustproof performances is arranged on the rear surface of motor 200, specifically at the position facing the end of output shaft 200A. Thus, the inner space of cover 340 attached to the rear surface of motor 200 communicates with the outer space via ventilation filter 350 and the inner space of motor 200, and may suppress pressure fluctuations in the inner space of cover 340 even if the temperature changes, for example.

Figure 4:
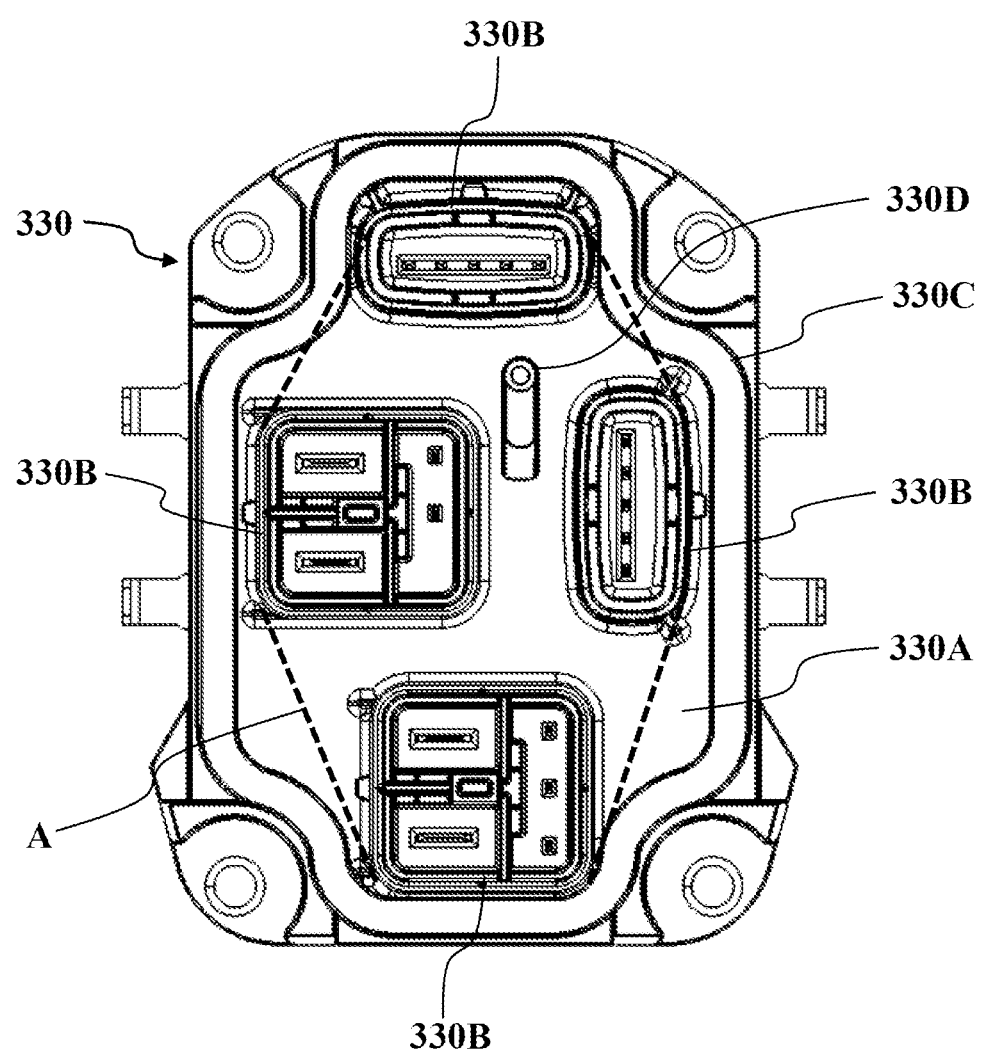
FIG. 4 is a plan view showing an example of a connector block.

As shown in FIG. 4, ventilation hole 330D is formed in bottom plate 330A of connector block 330, and ventilation hole 330D communicates the inner space with the outer space of cover 340 in plan view of connector block 330. Ventilation hole 330D is formed in the section excluding the formation positions of connectors 330B that are integrally formed with connector block 330, and preferably, is formed within an area A (within the dashed line range) in which the contours of four connectors 330B are linked by a single non-intersecting line in plan view of connector block 330.

Figure 5:
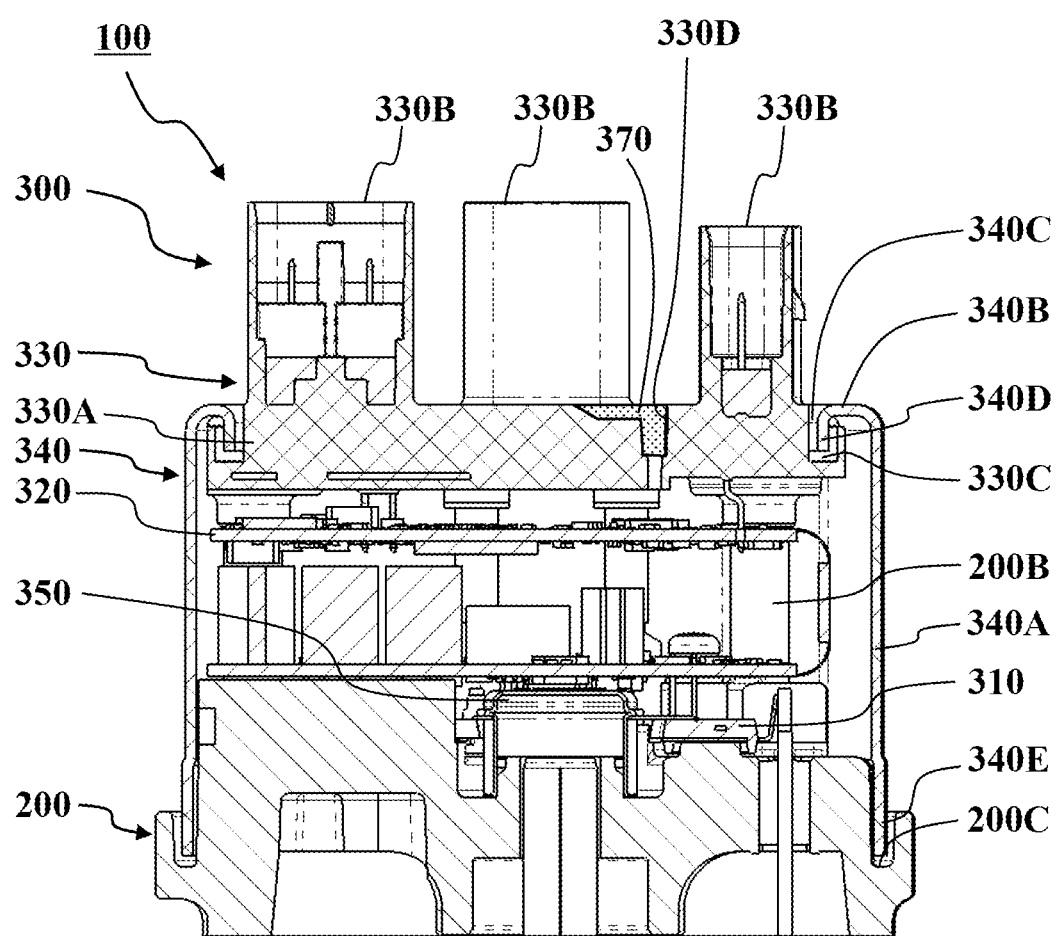
FIG. 5 is a vertical cross-sectional view showing an example of the main part of the motor unit after sealing a ventilation hole.

As shown in FIG. 5, ventilation hole 330D that is formed in connector block 330 is sealed with a sealing material 370. Sealing material 370 may be a liquid gasket such as a Formed-In-Place-Gasket (FIPG), which has the properties of being in a fluid state in the initial state and being cured over time or by a curing treatment.

Figure 6:
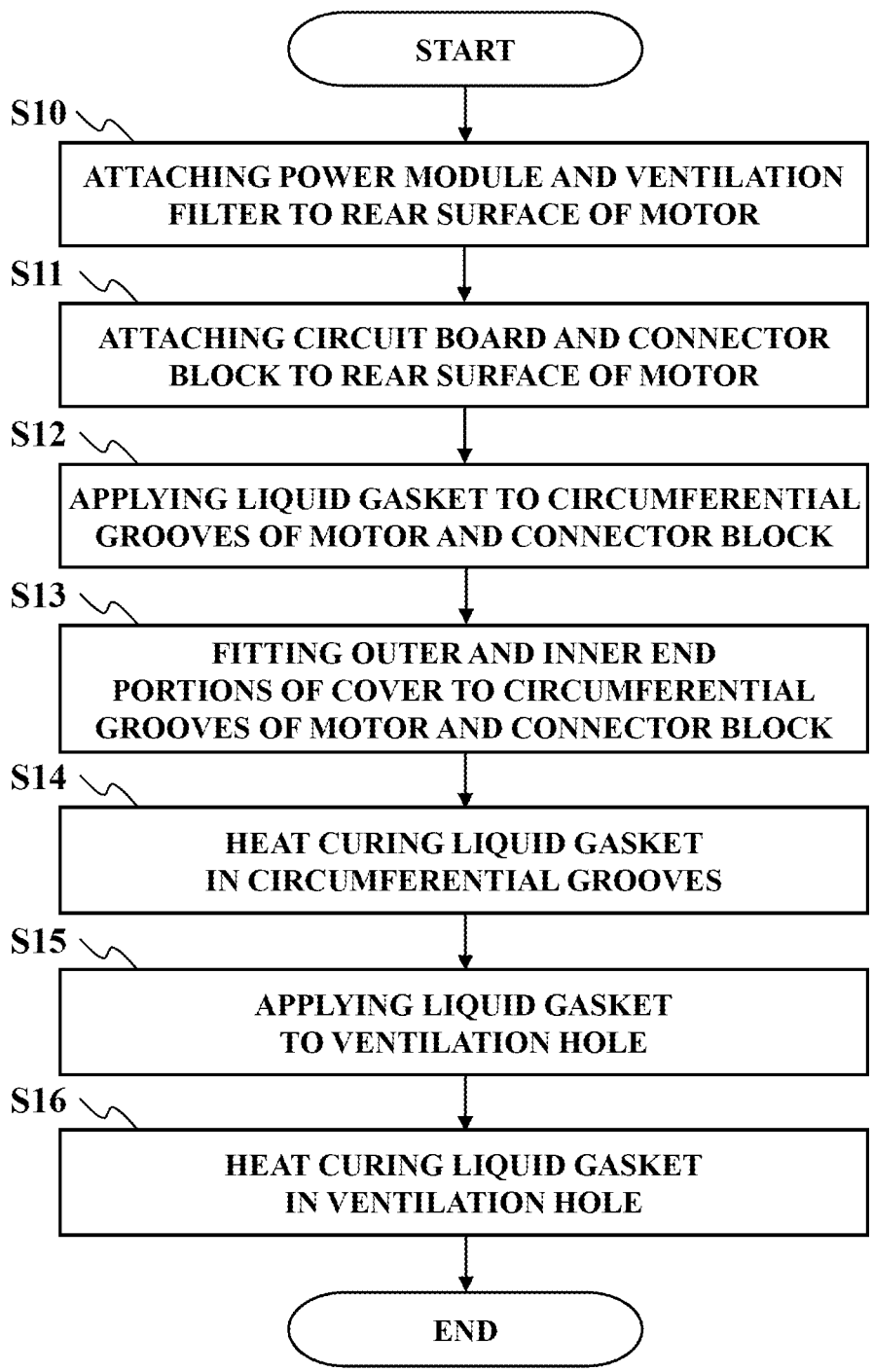
FIG. 6 is a flowchart of a procedure showing an example of a method for manufacturing the motor unit.

Here, with reference to FIG. 6, an outline of a method for manufacturing motor unit 100 and, by extension, a method for manufacturing electronic control device 300 will be described. In the following description, the heat-curing liquid gasket is used as sealing material 370. Note that the manufacturing method described below is merely an outline.

In Step 10 (abbreviated as "S10" in FIG. 6; the same applies below), an operator involved in manufacturing motor unit 100 attaches power module 310 and ventilation filter 350 to predetermined locations on the rear surface of motor 200. Of course, when power module 310 is attached to the rear surface of motor 200, the operator also needs to electrically connect motor 200 and power module 310 (the same applies below).

In Step 11, the operator further attaches circuit board 320 and connector block 330 to the rear surface of motor 200. Specifically, the operator locates connector block 330 to the tips of four mounting bosses 200B that are erected from the rear surface of motor 200 while interposing circuit board 320 between connector block 330 and mounting bosses 200B. The operator then fastens and fixes connector block 330 to mounting bosses 200B by screwing screws 360 into the tips of mounting bosses 200B.

In step 12, the operator uses, for example, a nozzle for applying the liquid gasket, to apply an appropriate amount of liquid gasket over the entire circumferences of circumferential groove 200C that is formed in the rear surface of motor 200 and circumferential groove 330C that is formed in bottom plate 330A of connector block 330. Since the liquid gasket is in a fluid state in the initial state, the liquid gasket can be easily applied to circumferential groove 200C of motor 200 and circumferential groove 330C of connector block 330. Note that the operation for applying the liquid gasket is not limited to manual application by the operator, and may be automatic application by means of a robot, for example (the same applies below).

In step 13, with respect to circumferential groove 200C of motor 200 and circumferential groove 330C of connector block 330 to which the liquid gasket has been applied, the operator fits and pushes outer end portion 340E and inner end portion 340D of cover 340, respectively, into predetermined positions, as shown in FIG. 3.

At this time, because outer end portion 340E and inner end portion 340D of cover 340 are pushed into circumferential grooves 200C and 330C, the inner space of cover 340, which is partitioned by motor 200, bottom plate 330A of connector block 330, and cover 340, is rapidly reduced in volume. As a result, the internal pressure of the inner space of cover 340 is increased, and the liquid gasket that has been applied to circumferential grooves 200C and 330C may flow out.

However, because ventilation hole 330D is formed in the plate surface of bottom plate 330A of connector block 330, specifically in a section excluding the formation positions of connectors 330B, air with increased internal pressure in the inner space of cover 340 is discharged to the outer space through ventilation hole 330D. Therefore, the pressure fluctuations in the inner space of cover 340 are suppressed, and the liquid gasket that has been applied to circumferential groove 200C of motor 200 and circumferential groove 330C of connector block 330 may be suppressed from flowing out. Note that ventilation filter 350 arranged in the inner space of cover 340 has a higher ventilation resistance than ventilation hole 330D, and thus, it cannot suppress sudden pressure fluctuations in the inner space.

In step 14, the operator applies heat to the liquid gasket that has been applied to circumferential groove 200C of motor 200 and circumferential groove 330C of connector block 330 to heat cure the liquid gasket. By heat curing the liquid gasket that has been applied to circumferential grooves 200C and 330C, cover 340 may be fixed to motor 200 and connector block 330, and sealing performances among them may be exhibited. In addition to the liquid gasket, screws (not shown) may be used to fix cover 340 to motor 200 and connector block 330. If the liquid gasket has a UV curable property, the liquid gasket may be irradiated with ultraviolet light instead of heat (the same applies below).

In step 15, the operator uses, for example, a nozzle for applying the liquid gasket, and applies the liquid gasket from the position facing connectors 330B of connector block 330, that is, from the outer space of cover 340, to ventilation hole 330D.

In step 16, the operator applies heat to the liquid gasket that has been applied to ventilation hole 330D of connector block 330 to heat cure the liquid gasket. When the liquid gasket that has been applied to ventilation hole 330D is heat cured, the liquid gasket turns into sealing material 370, and ventilation hole 330D which communicates the inner space with the outer space of cover 340 is sealed to block moisture and dust from entering into the inner space of cover 340. After ventilation hole 330D is sealed, pressure fluctuations are suppressed by ventilation filter 350 that is arranged in the inner space of cover 340, and thus, problems are unlikely to occur even if the temperature in the inner space of cover 340 rises or falls, for example.

Figure 7:
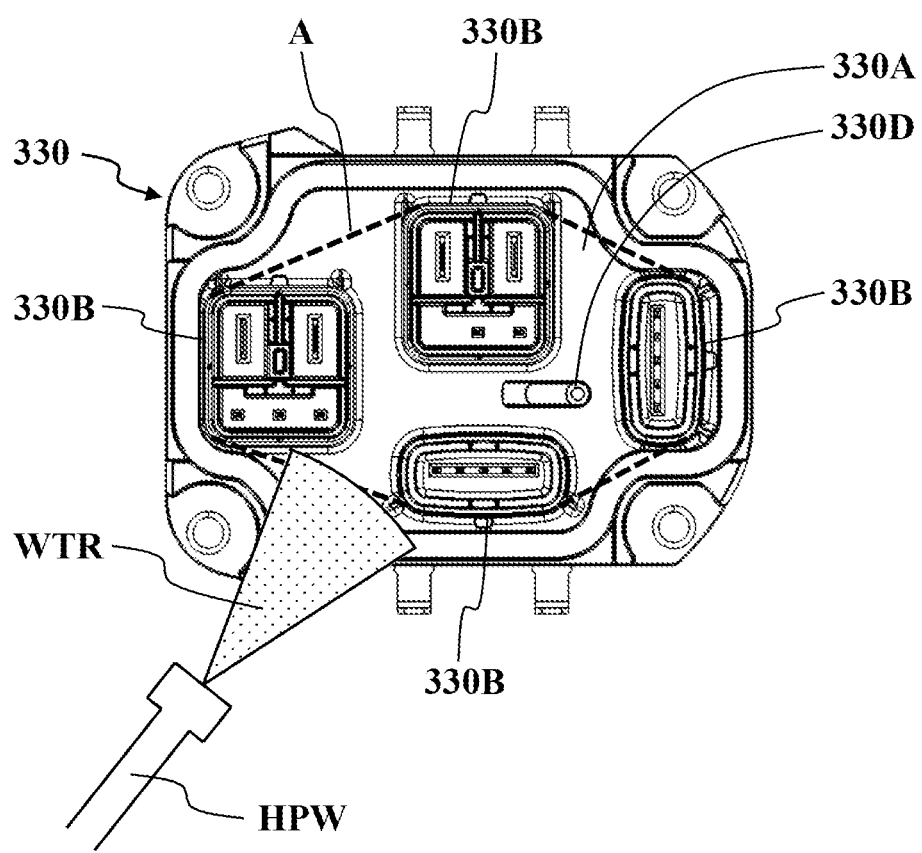
FIG. 7 is a view for explaining the reason a liquid gasket part can be protected during high-pressure washing.

Regarding such manufactured motor unit 100, as shown in FIG. 7, ventilation hole 330D is formed in area A described above, and thus, even if connector block 330 is exposed to high-pressure water WTR that is jetted from a high-pressure washer machine HPW, ventilation hole 330D is less likely to be directly hit by high-pressure water WTR because connectors 330B are located around ventilation hole 330D. Therefore, it is possible to suppress sealing material 370 that seals ventilation hole 330D of connector block 330 from being damaged by the high-pressure water WTR, and to suppress the end of sealing material 370 from turning up and moisture entering into the inner space of cover 340.

Figure 8:
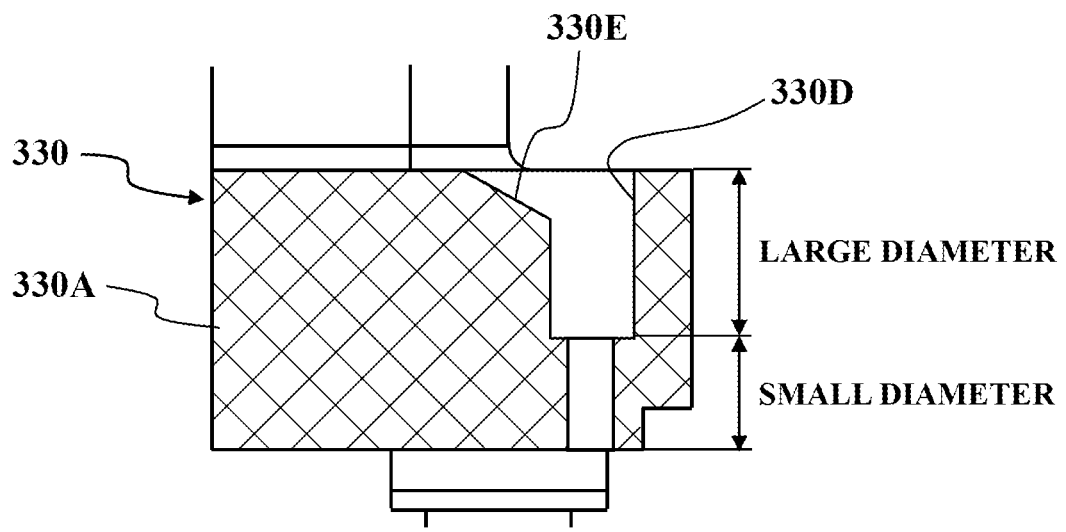
FIG. 8 is a cross-sectional view of the main part showing a first modification of the ventilation hole of the connector block.

As shown in FIG. 8, ventilation hole 330D of connector block 330 may have a stepped columnar shape in which the open end facing the outer space of cover 340 is formed to have a large diameter and the open end facing the inner space of cover 340 is formed to have a small diameter. In this way, the open end of ventilation hole 330D on which the liquid gasket is to be applied has a large diameter, and thus, the liquid gasket can be easily applied to ventilation hole 330D. Furthermore, in the step section at which the large diameter portion transitions to the small diameter portion, the liquid gasket that has been applied to ventilation hole 330D is blocked from being supplied to the small diameter portion, and thus, it is possible to suppress the liquid gasket from entering into the inner space of cover 340 through the small diameter portion.

In bottom plate 330A of connector block 330, as shown in FIG. 8, at least a part in the radial direction of the open end of ventilation hole 330D that faces the outer space of cover 340 may be formed with an inclined portion 330E that gradually deepens from the outer space toward the inner space of cover 340. In plan view of connector block 330, inclined portion 330E may have a shape of a rectangular recessed groove having substantially the same width as the large diameter portion of ventilation hole 330D, a recessed groove spreading out in a fan shape from the large diameter portion of ventilation hole 330D, or a circular recessed groove concentrically arranged with ventilation hole 330D. The liquid gasket is started to be applied from above the large diameter portion of ventilation hole 330D by using the nozzle, and after a predetermined amount of liquid gasket is applied to ventilation hole 330D, the application of liquid gasket is terminated while moving the nozzle to inclined portion 330E.

In this way, the liquid gasket that has been applied to inclined portion 330E is supplied to ventilation hole 330D along the bottom surface of inclined portion 330E due to gravity, and thus, the surface of the applied end of the liquid gasket is flattened and a convex portion is less likely to be generated. Moreover, when the liquid gasket is applied to inclined portion 330E, the distance between the nozzle and the bottom surface of inclined portion 330E is reduced so that the liquid gasket is cut well and a large convex portion is less likely to be generated. This allows receiving less damage even if the applied end of liquid gasket that has been applied to ventilation hole 330D is exposed to high-pressure water WTR of high-pressure washer machine HPW.

Figure 9:
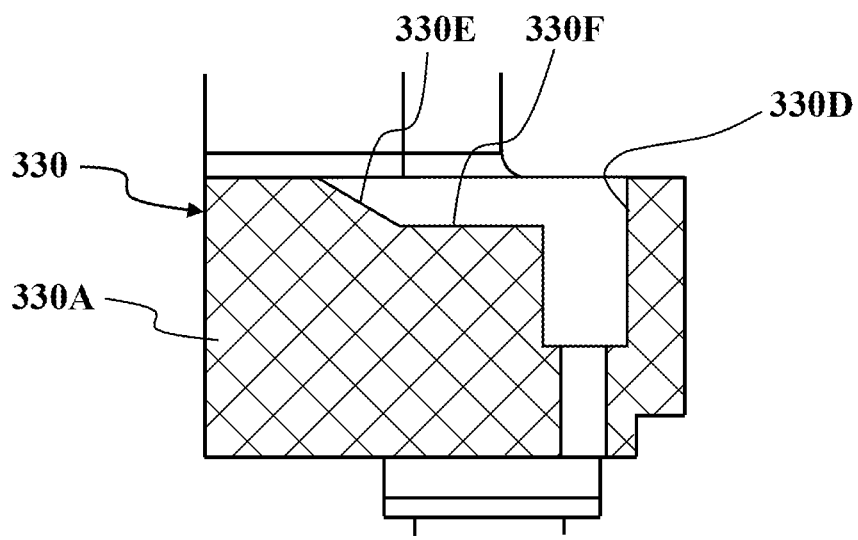
FIG. 9 is a cross-sectional view of the main part showing a second modification of the ventilation hole of the connector block.

In bottom plate 330A of connector block 330, as shown in FIG. 9, at least a part in the radial direction of the open end of ventilation hole 330D which faces the outer space of cover 340 is formed with a recessed groove-shaped horizontal passage 330F that extends outwardly toward the radial direction of ventilation hole 330D, and its tip may be formed with an inclined portion 330E. In this way, the surface of the applied end of liquid gasket can be further smoothed by gradually decreasing the amount of application of liquid gasket while moving the nozzle along horizontal passage 330F when terminating the application of liquid gasket to ventilation hole 330D. Therefore, even if the applied end of liquid gasket is exposed to high-pressure water WTR of high-pressure washer machine HPW, it is possible to suppress the liquid gasket from turning up. Note that horizontal passage 330F is an example of the recess.

Figure 10:
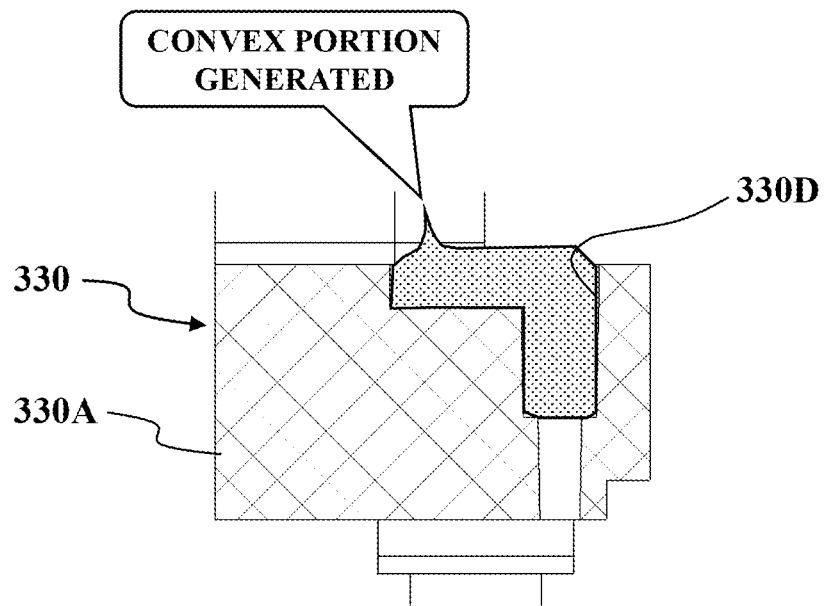
FIG. 10 is a view explaining a convex portion generated at the applied end of the liquid gasket.
Figure 11:
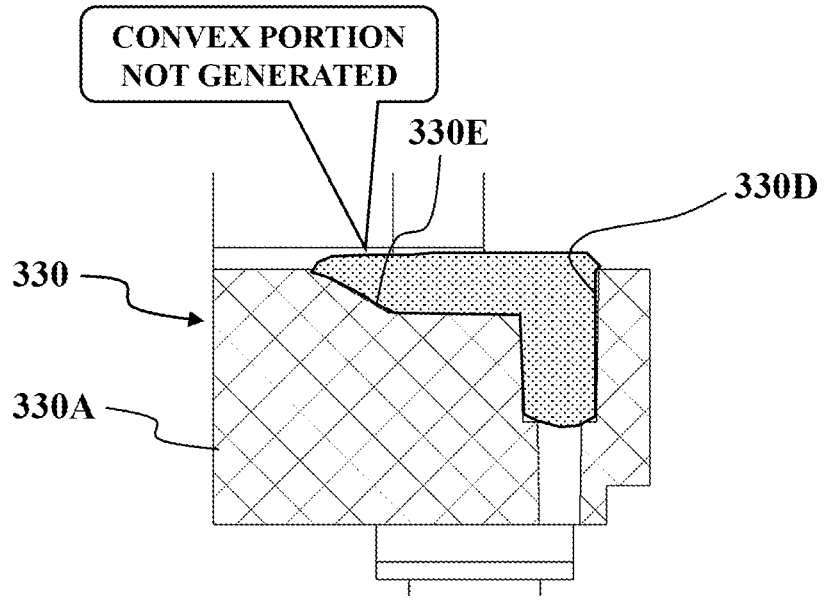
FIG. 11 is a view explaining an effect of the second modification of the ventilation hole.

If the recessed groove formed in the open end of ventilation hole 330D simply extends in the radial direction of the open end, as shown in FIG. 10, when the application of a liquid gasket is terminated at the recessed groove, the liquid gasket is not cut well due to a large distance between the nozzle and the recessed groove, and the convex portion is generated at the applied end of the liquid gasket. However, if at least a part of the bottom surface of the recessed groove is inclined portion 330E, as shown in FIG. 11, the liquid gasket that has been applied to inclined portion 330E flows into the recessed groove due to gravity, the distance between the nozzle and the bottom surface of inclined portion 330E is reduced, and the liquid gasket is cut well. Thus, the convex portion is less likely to be generated at the applied end of the liquid gasket.

Figure 12:
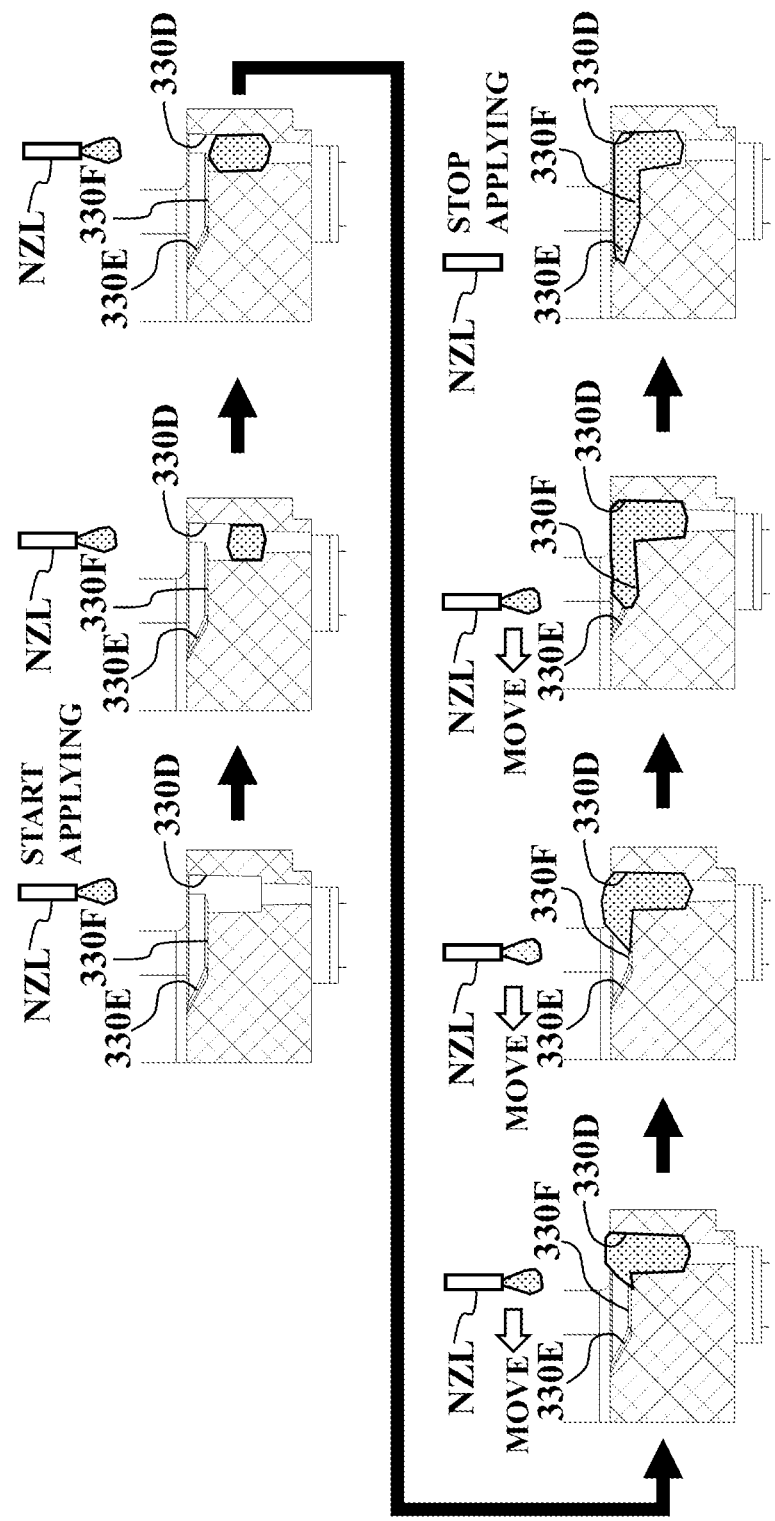
FIG. 12 is a procedure diagram showing an example of a method of applying the liquid gasket to the ventilation hole.

FIG. 12 shows an example of a method of applying the liquid gasket to ventilation hole 330D, and a method of manufacturing electronic control device 300.

A nozzle NZL for applying the liquid gasket is located above ventilation hole 330D and starts applying the liquid gasket from the large diameter portion of ventilation hole 330D to its inside. When the application of the liquid gasket is completed up to the transition part of horizontal passage 330F with respect to the large-diameter portion of ventilation hole 330D, the application of the liquid gasket is terminated at inclined portion 330E that is located at the tip of horizontal passage 330F while moving nozzle NZL along horizontal passage 330F. When the application of the liquid gasket is terminated at inclined portion 330E, the applied end of the viscous liquid gasket is somewhat raised in a convex shape, and this is supplied to horizontal passage 330F along the bottom surface of inclined portion 330E due to gravity so that its surface shape becomes smooth without having large convex portions. Moreover, as described above, the distance between nozzle NZL and the bottom surface of inclined portion 330E is reduced and the liquid gasket is cut well. Thus, a convex portion is less likely to be generated at the applied end of the liquid gasket.

Figure 13:
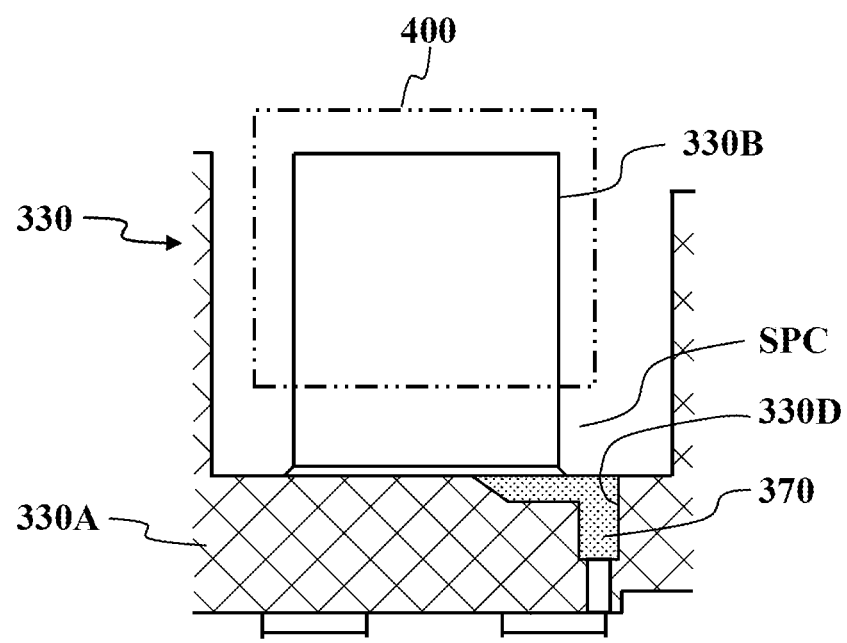
FIG. 13 is a cross-sectional view of the main part showing an example of a formation position of the ventilation hole.

As shown in FIG. 13, while in a state in which connector 330B is coupled with a mutual another connector 400, at least a part of ventilation hole 330D of connector block 330 may be formed in the position that opposes the tip surface of another connector 400 in plan view of connector block 330. In this case, as shown in FIG. 13, it is desirable to provide a gap space SPC between the tip surface of another connector 400 and sealing material 370 in order to suppress interference with sealing material 370 that seals ventilation hole 330D. In this way, sealing material 370 that seals ventilation hole 330D of connector block 330 may be prevented from interfering with the tip surface of another connector 400.

Figure 14:
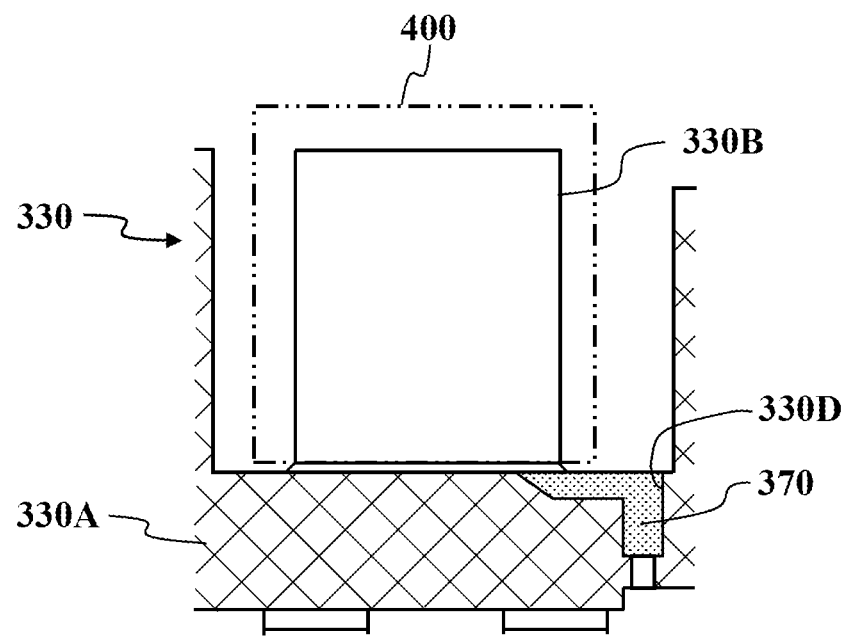
FIG. 14 is a cross-sectional view of the main part showing another example of the formation position of the ventilation hole.

As shown in FIG. 14, in a state in which mutual another connector 400 is coupled to connector 330B, ventilation hole 330D of connector block 330 may be formed in the section located exterior of another connector 400 in plan view of connector block 330. In this way, sealing material 370 that seals ventilation hole 330D of connector block 330 may be prevented from interfering with the tip surface of another connector 400.

One skilled in the art could have readily understood that a new embodiment can be made by omitting a part of the technical idea of the embodiments, freely combining parts of the technical idea of the embodiments, and substituting a part of the technical idea of the embodiments with well-known technique.

For example, power module 310 may be mounted on circuit board 320 instead of being arranged on the rear surface of motor 200. Furthermore, the base of electronic control device 300 is not limited to the rear surface of motor 200, and it may be a plate-like base, for example.

REFERENCE SYMBOL LIST 200 motor (base)
200C circumferential groove
300 electronic control device
320 circuit board
330 connector block
330B connector
330C circumferential groove
330D ventilation hole
330E inclined portion
330F horizontal passage (recess)
340 cover
350 ventilation filter
370 sealing material
400 another connector
SPC gap space

The invention claimed is:

1. An electronic control device comprising:
   a circuit board on which electronic components are mounted;
   a connector block integrated with a connector that is electrically connected to the circuit board, wherein a plurality of connectors is integrated in the connector block;
   a base to which the circuit board is fixed;
   a cover that can be fitted to circumferential grooves that are formed in the base and the connector block respectively so that a connecting portion of the connector protrudes to the outside while accommodating the circuit board that is fixed to the base;
   a ventilation hole formed in a section of the connector block excluding a formation position of the connector so as to communicate an inner space with an outer space of the cover and in an area in which contours of the plurality of connectors are linked by a single non-intersecting line in plan view of the connector block; and
   a sealing material that seals the ventilation hole.

2. The electronic control device as claimed in claim 1, wherein in a state in which another connector is coupled to the connector of the connector block, the ventilation hole is formed in a section located exterior of the other connector in plan view of the connector block.

3. The electronic control device as claimed in claim 1, wherein in a state in which another connector is coupled to the connector of the connector block, at least a part of the ventilation hole is formed at a position that opposes a tip surface of the other connector, and a gap space is formed between the tip surface of the other connector and the sealing material that seals the ventilation hole.

4. The electronic control device as claimed in claim 1, further comprising a ventilation filter that can communicate the inner space with the outer space of the cover, and wherein a ventilation resistance of the ventilation hole is smaller than that of the ventilation filter.

5. The electronic control device as claimed in claim 1, wherein the sealing material has properties of being in a fluid state in an initial state and being cured over time or by a curing treatment, and in the connector block, at least a part in a radial direction of an open end of the ventilation hole which faces the outer space of the cover is formed with an inclined portion that gradually deepens from the outer space toward the inner space of the cover.

6. The electronic control device as claimed in claim 1, wherein in the connector block, at least a part in a radial direction of an open end of the ventilation hole which faces the outer space of the cover is formed with a recess that extends outwardly toward the radial direction of the ventilation hole, and a tip of the recess is formed with an inclined portion that gradually deepens from the outer space toward the inner space of the cover.

7. The electronic control device as claimed in claim 1, wherein the ventilation hole has a stepped columnar shape in which an open end which faces the outer space of the cover is formed to have a large diameter.

8. The electronic control device as claimed in claim 1, wherein the sealing material is composed of a liquid gasket.

* * * * *